United States Patent
Lee et al.

(10) Patent No.: US 8,859,335 B2
(45) Date of Patent: Oct. 14, 2014

(54) METHOD AND SYSTEM FOR CONTROLLING CHIP INCLINATION DURING FLIP-CHIP MOUNTING

(71) Applicant: Fujitsu Limited, Kanagawa (JP)

(72) Inventors: Michael G. Lee, Saratoga, CA (US); Chihiro Uchibori, Campbell, CA (US)

(73) Assignee: Fujitsu Limited, Kawasaki-shi (JP)

( * ) Notice: Subject to any disclaimer, the term of this patent is extended or adjusted under 35 U.S.C. 154(b) by 0 days.

(21) Appl. No.: 13/667,727

(22) Filed: Nov. 2, 2012

(65) Prior Publication Data

US 2014/0124917 A1   May 8, 2014

(51) Int. Cl.
*H01L 21/00* (2006.01)

(52) U.S. Cl.
USPC ........... 438/108; 438/455; 438/457; 257/737; 257/E21.506

(58) Field of Classification Search
USPC .......... 438/108, 455, 457; 257/737, 738, 723, 257/E21.506, E23.023
See application file for complete search history.

(56) References Cited

U.S. PATENT DOCUMENTS

| | | | |
|---|---|---|---|
| 7,803,693 B2 * | 9/2010 | Trezza | 438/457 |
| 2004/0222510 A1 * | 11/2004 | Aoyagi | 257/686 |

\* cited by examiner

*Primary Examiner* — Zandra Smith
*Assistant Examiner* — Paul Patton
(74) *Attorney, Agent, or Firm* — Baker Botts L.L.P.

(57) ABSTRACT

A method for alignment of a first substrate coupled to a second substrate includes determining an inclination angle for the first substrate or the second substrate due to warpage. The method includes determining a joint height difference based on the inclination angle and configuring a size for one or more bond pads based on the joint height difference.

15 Claims, 6 Drawing Sheets

US 8,859,335 B2

METHOD AND SYSTEM FOR CONTROLLING CHIP INCLINATION DURING FLIP-CHIP MOUNTING

TECHNICAL FIELD

The present invention generally relates to controlling chip inclination during flip-chip mounting.

BACKGROUND

In a semiconductor device assembly, a semiconductor die (also referred to as an integrated circuit (IC) chip or die) may be bonded directly to a packaging substrate. Such chips may be formed with ball-shaped beads or bumps of solder affixed to their I/O bonding pads. The semiconductor device assembly may be directly bonded to a printed circuit board (PCB) using a similar solder joining operation. During cooling, the chips and the assembly package may become warped due to coefficient of thermal expansion (CTE) mismatch between the chip and the package. Warpage is a global phenomenon, and the larger the package or chip is, the more warpage it will experience. A small die that may be bonded to a larger package may not experience much warpage itself, but it may be tilted due to the warpage of the package. With the propagation of optical dies and chips, the alignment of the die to an optical PCB may be critical for proper function. Both the warpage and tilt may cause the die to be positioned differently than originally designed.

SUMMARY

In particular embodiments, a method for alignment of a first substrate coupled to a second substrate includes determining an inclination angle for the first substrate or the second substrate due to warpage. The method includes determining a joint height difference based on the inclination angle and configuring a size for one or more bond pads based on the joint height difference.

In another method of the present invention for providing a semiconductor assembly, a first substrate is provided. The method includes positioning a plurality of joints. The plurality of joints comprising a plurality of solder bumps. The method includes coupling a second substrate to the first substrate. The second substrate comprising a plurality of bond pads. The size of the plurality of bond pads configured to provide a joint height difference between the plurality of joints to account for an inclination angle of either the first substrate or the second substrate due to warpage.

In another embodiment, a semiconductor assembly includes a first substrate and a plurality of joints. The plurality of joints comprising a plurality of solder bumps. The assembly includes a second substrate coupled to the first substrate. The second substrate comprising a plurality of bond pads. The size of the plurality of bond pads configured to provide a joint height difference between the plurality of joints to account for an inclination angle of either the first substrate or the second substrate due to warpage.

The object and advantages of the invention will be realized and attained by means of at least the features, elements, and combinations particularly pointed out in the claims. It is to be understood that both the foregoing general description and the following detailed description are exemplary and explanatory and are not restrictive of the invention, as claimed.

DETAILED DESCRIPTION

Embodiments of the present invention and its advantages are best understood by referring to FIGS. 1-12 of the drawings, like numerals being used for like and corresponding parts of the various drawings.

Figure 1:
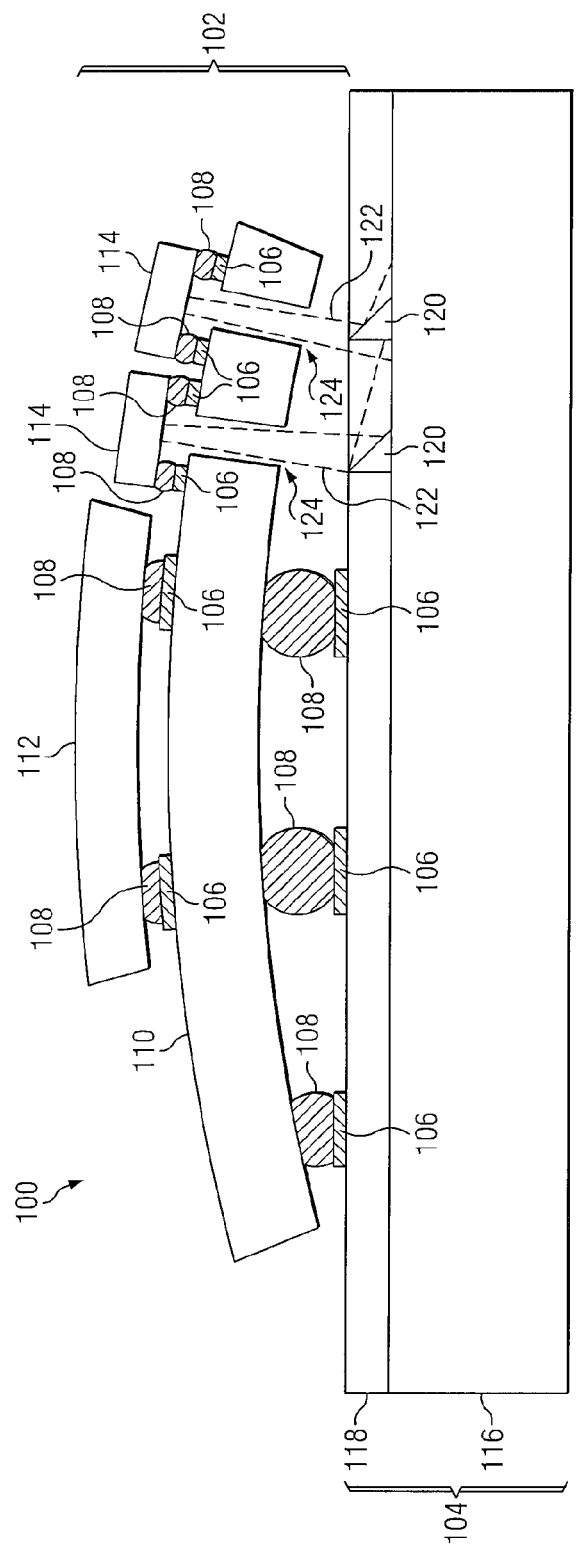
FIG. 1 illustrates a section of an example component board assembly, in accordance with one embodiment of the present disclosure.

FIG. 1 illustrates a section of an example component board assembly 100, in accordance with one embodiment of the present disclosure. Component board assembly 100 includes semiconductor assembly 102 and optical board 104. Semiconductor assembly 102 is a device in which one or more electrical chips 112 and/or optical chips 114 may couple to package 110, which may also be called a "substrate." Electrical chips 112 and/or optical chips 114 may couple to optical board 104 by or through package 110. During packaging, electrical chips 112 and/or optical chips 114 may be "flipped" onto their active circuit surface so that solder bumps 108 form electrical connections directly between the chip and conductive pads or traces on a package or substrate. Electrical chips 112 and/or optical chips 114 of this type are commonly called "flip chips." Accordingly, semiconductor assembly 102 may also be referred to as a "flip-chip package" or "flip-chip assembly."

Typically, to couple electrical chips 112 and/or optical chips 114 to package 110, solder bumps 108 may be applied to the surface of electrical chips 112 and/or optical chips 114. Electrical chips 112 and/or optical chips 114 and solder bumps 108 may align over package 110 such that each solder bump 108 at least partially fills bond pad 106 on package 110, and such that electrical chip 112 and/or optical chip 114 is spaced apart from package 110.

Solder bumps 108 may comprise any suitable material operable to interconnect electrical chips 112 and/or optical chips 114 to package 110. According to various embodiments, solder bumps 108 may comprise any suitable conductive material such as gold, tin, lead, or copper, for example. According to other embodiments, solder bumps 108 may be replaced by other types of interconnections such as microelectronic interconnections, optical interconnections, or any other suitable interconnections.

In packaging, electrical chips 112 and/or optical chips 114 and package 110 may be electrically connected and mechanically bonded in a solder joining operation. Heat may be applied causing solder bumps 108 to alloy and form electrical connections between electrical chips 112 and/or optical chips 114 and package 110. The package may then be cooled to harden the connection. Additionally, although selected components of semiconductor assembly 102 are illustrated in FIG. 1 at a high level, other materials and coupling techniques might be used. Moreover, semiconductor assembly 102 may include any other well-known components and the techniques described herein may be applied to many varieties of semiconductor assemblies such as chip on chip, chip on substrate, electro-optic component on chip, and micro-electro-mechanical systems (MEMS) on chip, for example.

During cooling, electrical chip 112 and/or optical chip 114 and package 110 may warp due to coefficient of thermal expansion (CTE) mismatch between electrical chip 112 and/or optical chip 114 and package 110. A small electrical chip 112 and/or optical chip 114 that may bond to a larger package 110 may not experience much warpage itself, but it may tilt due to the warpage of package 110. Both the warpage and tilt may cause electrical chip 112 and/or optical chip 114 to be positioned differently than originally designed. With the propagation of optical dies and chips, the alignment of optical dies on an optical printed circuit board (PCB) may be critical for proper function. As described in more detail below in conjunction with the subsequent figures, variations in the size of bond pads and/or pillars disposed on the chip, on the package, and/or suspended between the chip and the substrate may control chip inclination. Controlling chip inclination may allow the position of optical dies and chips to be adjusted for warpage and resultant tilt.

Package 110 may include any suitable surface and may be formed of any suitable ceramic or organic material. For example, package 110 may comprise a plastic surface mount for electrical chip 112 and/or optical chip 114. As another example, package 110 may comprise a second semiconductor chip that also acts as a package for electrical chip 112 and/or optical chip 114. Selection of a material for package 110 may concern minimizing the CTE difference between package 110 and electrical chip 112 and/or optical chip 114. For example, ceramic materials may have a CTE closer to electrical chip 112 and/or optical chip 114. However, ceramic materials may be significantly more cost prohibitive than other materials. Likewise, mechanical stiffeners (not expressly shown) made of metals or ceramics may be used on package 110 to reduce warpage and consequently local tilts of electrical chips 112 and/or optical chips 114. Yet, like ceramic substrates, use of a stiffener may require additional processing and subsequent costs.

Electrical chips 112 and/or optical chips 114 may include any suitable substrate and may be formed of any suitable ceramic or organic material. Electrical chips 112 and/or optical chips 114 may also be referred to generally as "substrates" and may comprise any suitable device operable to perform data transmission. For example, electrical chips 112 and/or optical chips 114 may perform data transmission using electric signals or optical signals. Electrical chips 112 and/or optical chips 114 may refer to a silicon chip, microelectronic chip, optoelectronic chip, MEMS chip, microchip die, integrated circuit, or any other suitable data transmission device. In addition to bonding methods discussed above, electrical chips 112 and/or optical chips 114 may be coupled to package 110 by any suitable technique, such as by flip-chip coupling, for example.

Optical board 104 comprises board 116, a network of electrical traces (not expressly shown) formed in and/or on board 116, optical layer 118, and a plurality of optical deflectors 120 formed in and/or on optical layer 118. Optical board 104 may be a component board of any electro-optic-based system, such as daughter boards of a computer system or processor blades of a network server. Board 116, which may also generally be called a "substrate" or "board substrate," may comprise any suitable material operable to perform electronic transmission. For example, board 116 may be a PCB. The network of electrical traces (not expressly shown) on and/or in board 116 electrically interconnects electrical chips 112 and/or semiconductor assemblies 102 to one another, and may interconnect selected electrical chips 112 and/or semiconductor assemblies 102 to optical chips 114 or other optical electrical devices (not expressly shown) and optical deflectors 120. Electrical traces (not expressly shown) may connect the desired components based on the designed functions performed by the components and the system.

Optical chips 114, optical deflectors 120, and/or other opto-electrical components may communicate through channels 124 that may provide optical-signal interconnections within and/or among optical board 104. Each optical chip 114 may comprise one or more light transmitters, light receivers, and/or a combination of light transmitter(s) and light receiver (s). Optical chip 114 may receive and/or transmit optical information signals 122 to and/or from other optical devices (not expressly shown). Optical chip 114 may generate optical information signal 122 from an electrical information signal. Optical information signal 122 may originate from a laser or any other appropriate light source. Optical chip 114 may couple to package 110, which may couple to optical board 120, and may optically communicate optical information signal 122 to and/or from optical deflector 120 on and/or in optical layer 118. Channels 124 may extend through package 110 and may allow alignment of optical components of optical chip 114 such that transmission and/or receiving optical information signal 122 may be accomplished without significant or undue attenuation. Optical information signal 122 may pass through channel 120 formed in package 110. Optical deflector 120 may route optical information signal 122 to and/or from additional optical deflectors 120 and/or any other appropriate component. Optical deflectors 120 formed in and/or on optical layer 118 may interconnect optical signals and optionally interconnect with a network of electrical traces (not expressly shown) across optical board 104. Optical deflectors 120 may be formed of mirrors, grates, or any other suitable material including a reflective surface.

In some embodiments, package 110 and/or optical board 104 may include a solder mask (not expressly shown) that defines an opening for bond pads 106. Bond pads 106 may connect to circuitry within package 110 and/or allow package 110 to electrically (or otherwise) couple electrical chips 112 and/or optical chips 114 with an external device or with one or more other components coupled to package 110. Likewise, bond pads 106 may connect to circuitry within board 116 and/or allow board 116 to electrically (or otherwise) couple package 110, electrical chips 112 and/or optical chips 114 with an external device or with one or more other components coupled to board 116. Solder mask (not expressly shown) may comprise any suitable non-conductive material such as polymer, for example. Bond pads 106 may comprise any suitable conductive material such as copper, for example. Using methods discussed previously, package 110 may be coupled to optical board 104 by one or more solder bumps 108 during a re-flow operation or any other suitable bonding method.

In some embodiments, a small optical chip 114 that is packaged with a large electrical chip 112 on package 110 may not have much warpage, however, optical chip 114 may be tilted because package 110 is warped. Both warpage and tilts can cause light emitting or receiving components on optical chip 114 to be incorrectly positioned and improperly aligned based on the original design. Depending on the application, the appropriate direction may be vertically down to optical deflector 120 on optical layer 118 of optical board 104, or the appropriate direction may be at an oblique angle to optical layer 118, e.g., when the board or optical board itself has warpage. In an example of some embodiments, the alignment of an output aperture on a vertical-cavity surface-emitting laser (VCSEL) die to a mirror on an optical layer may not be accurate due to warpage or tilt. Accordingly, embodiments of the present disclosure may relate to alignment tuning for controlling optical chip 114 orientation on package 110, or package, so that optical components in optical chip 114 are positioned appropriately and properly aligned with optical deflector 120.

An alignment tuning method controls optical chip 114 orientation on package 110 so that the components on optical chip 114 are aligned appropriately. In some embodiments, as discussed in detail below, the joints between optical chip 114 and the package 110 may be adjusted to unequal heights to induce the correct orientation, or alignment tuning. In some embodiments, controlling the bond pad sizes may achieve the appropriate adjustment of joint heights. In an example embodiment, the joints may contain two materials. One material may be used to increase rigidity of the joint, while the other material may be used for fine-tuning the joint height. In addition, the tuning effect may use a lens to enhance accuracy. When optical chip 114 is tuned to a suitable orientation, the components on the optical chip are appropriately positioned and properly aligned with optical deflector 120.

Figure 2:
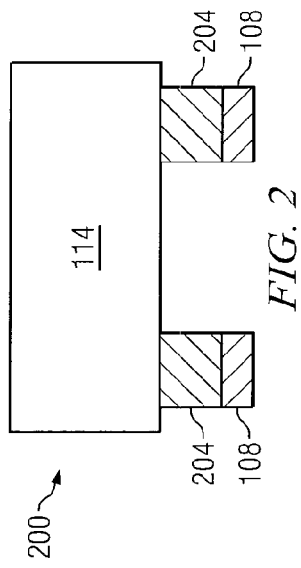
FIG. 2 illustrates an example optical chip assembly prior to bonding with a package, in accordance with one embodiment of the present disclosure.

Accordingly, FIG. 2 illustrates an example optical chip assembly 200 prior to bonding with a package, in accordance with one embodiment of the present disclosure. Optical chip assembly 200 may include optical chip 114, pillars 204 and solder bumps 108. Formation of pillars 204 may be by electroplating, lithography, or any other suitable method. Pillars 204 may consist of a material that improves rigidity and/or has a higher melting point than the melting point of solder bumps 108 or the bonding temperature. For example, copper may be used in some embodiments of the present disclosure.

Solder bumps 108 may be deposited on pillars 204. Solder bumps 108 may be formed by electroplating, lithography, or any other suitable method, in some embodiments of the present disclosure. According to various embodiments, solder bumps 108 may comprise any suitable conductive material such as gold, tin, lead, or a tin-lead composite material, for example. Solder bumps 108 may melt at the bonding temperature in a typical reflow operation. In embodiments of the present disclosure, solder bumps 108 on pillars 204 may be approximately equal amounts of material and/or approximately equal sizes. However, in other embodiments, solder bumps 108 may be of unequal sizes. Additionally, although not expressly shown, solder bumps 108 may be formed directly onto optical component 114.

Figure 3A:
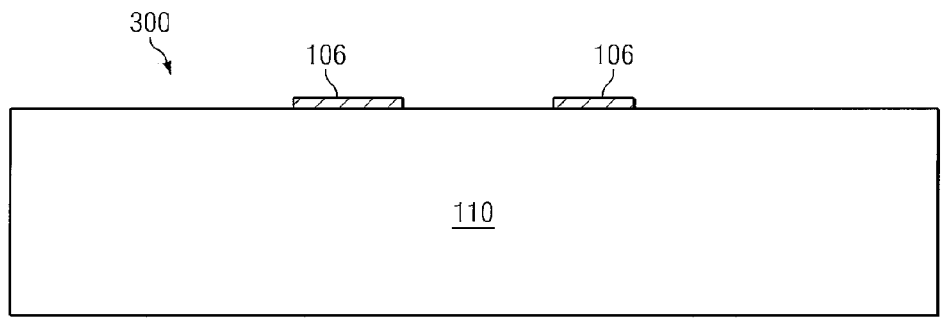
FIG. 3A illustrates a section of an example package assembly with solder pads of different dimensions, in accordance with one embodiment of the present disclosure.

FIG. 3A illustrates a section of an example package assembly 300 with solder pads 106 of different dimensions, in accordance with one embodiment of the present disclosure. Package assembly 300 includes package 110 and bond pads 106. Package 110 may contain bond pads 106 in some embodiments of the present disclosure. In other embodiments, the optical chip 114 may include bond pads 106. While in still other embodiments, a mid-plate that may be placed between the package 110 and the optical chip 114 that may include bond pads 106. Bond pads 106 may be of different sizes. The requisite height difference to achieve the required tilt of optical chip 114 may determine bond pad 106 dimensions. During bonding of package 110 and the optical die, solder bumps may alloy to substantially cover bond pads 106. If a bond pad 106 is larger, during bonding, the solder from the solder bump may spread creating smaller clearance between the optical die and the package. Accordingly, the edge of optical die 114 that may require a shorter joint may correspond to larger bond pad 106. The edge of optical die 114 that may require a taller joint may correspond to a standard size bond pad 106.

Figure 3B:
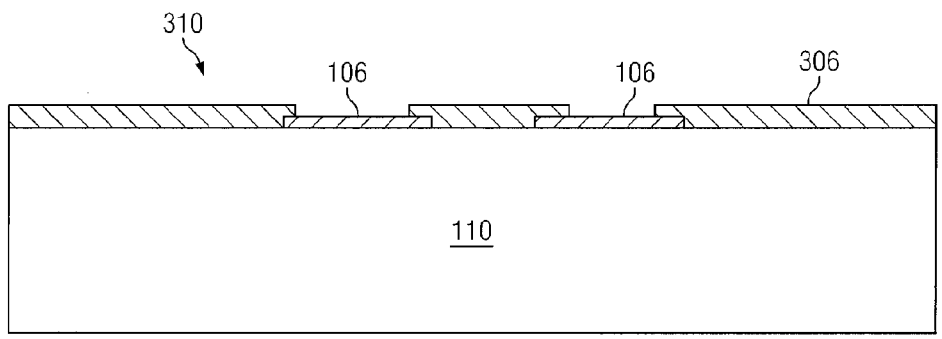
FIG. 3B illustrates a section of an example package assembly with solder mask used to create bond pads with different exposure dimensions, in accordance with one embodiment of the present disclosure.

Bond pad 106 sizes may be controlled by patterning the metal pads and/or by patterning solder mask 306 over the metal pads as shown in FIG. 3B. FIG. 3B illustrates a section of an example package assembly 310 with solder mask 306 used to create bond pads 106 with different exposure dimensions, in accordance with one embodiment of the present disclosure. During bonding, solder alloys from the solder bumps and may encounter only the exposed portions of bond pads 106. Solder mask 306 may substantially stop the solder from solder bumps 306 from flowing beyond the exposed bond pads 106. A larger exposed bond pad 106 area may allow solder to expand forming a shorter joint. Alternatively, a smaller exposed bond pad 106 area may not allow solder to expand as much forming a taller joint. As a consequence, optical chip 114 may slant from the side with the smaller bond pad to the side with the larger bond pads resulting in die inclination based on the resulting uneven joint heights. After cooling down, the die inclination at room temperature may approximate the die inclination formed at the bonding temperature, with minor changes due to shrinkage through thermal excursion.

Figure 4:
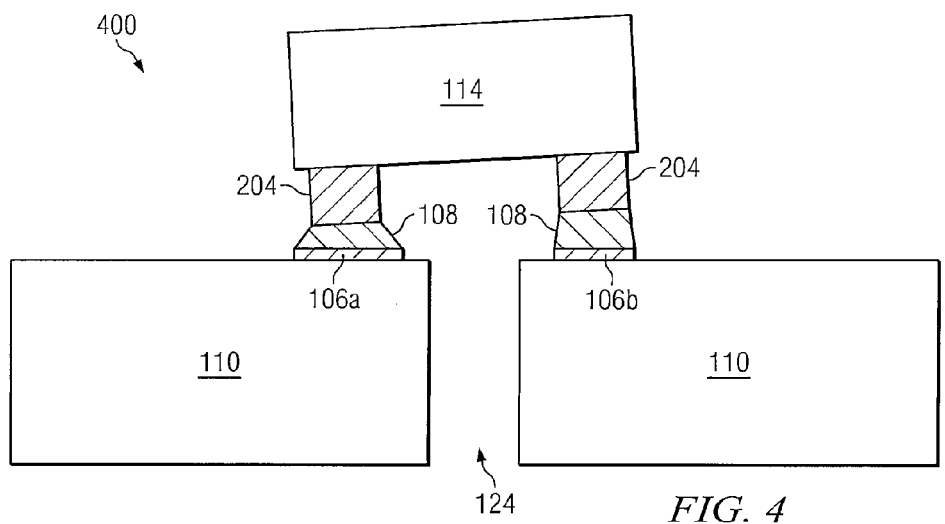
FIG. 4 illustrates a section of an example semiconductor assembly with bond pads of different dimensions, in accordance with one embodiment of the present disclosure.
Figure 5:
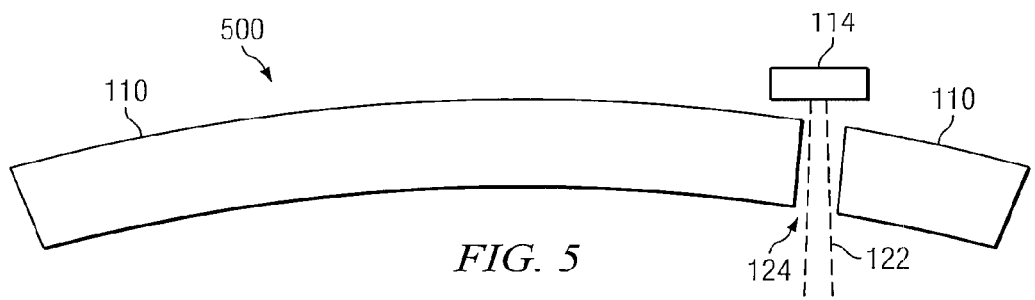
FIG. 5 illustrates a section of an example semiconductor assembly with an optical chip aligned such that the optical information signal is appropriately positioned and properly aligned with the optical deflector, in accordance with one embodiment of the present disclosure.

Accordingly, FIG. 4 illustrates a section of an example semiconductor assembly 400 with bond pads 106 of different dimensions, in accordance with one embodiment of the present disclosure. In the illustrated embodiment, pillars 204 may be formed on optical chip 114. Solder bumps 108 may be formed on pillars 204 as described previously. Optionally, solder bumps 108 may be formed directly on optical chip 114. Bond pad 106*a* may be larger than bond pad 106*b*. Bond pad 106a may be larger than bond pad 106b. Thus, during bonding solder bump 108 may flow such that the clearance between optical chip 114 and package 110 may be smaller on the side of optical chip 114 corresponding to bond pad 106a. Additionally, during bonding solder bump 108 may flow onto bond pad 106b such that the clearance between optical chip 114 and package 110 may be larger on the edge of optical chip 114 corresponding to bond pad 106b. As shown in FIG. 5, this inclination allows optical information signal 122 from and/or to optical chip 114 pass through channel 124 at the appropriate angle with respect to the optical deflectors (not expressly shown) for routing. Accordingly, FIG. 5 illustrates a section of an example semiconductor assembly 500 with optical chip 114 aligned such that optical information signal 122 is appropriately positioned and properly aligned with optical deflector 120, in accordance with one embodiment of the present disclosure.

Figure 6:
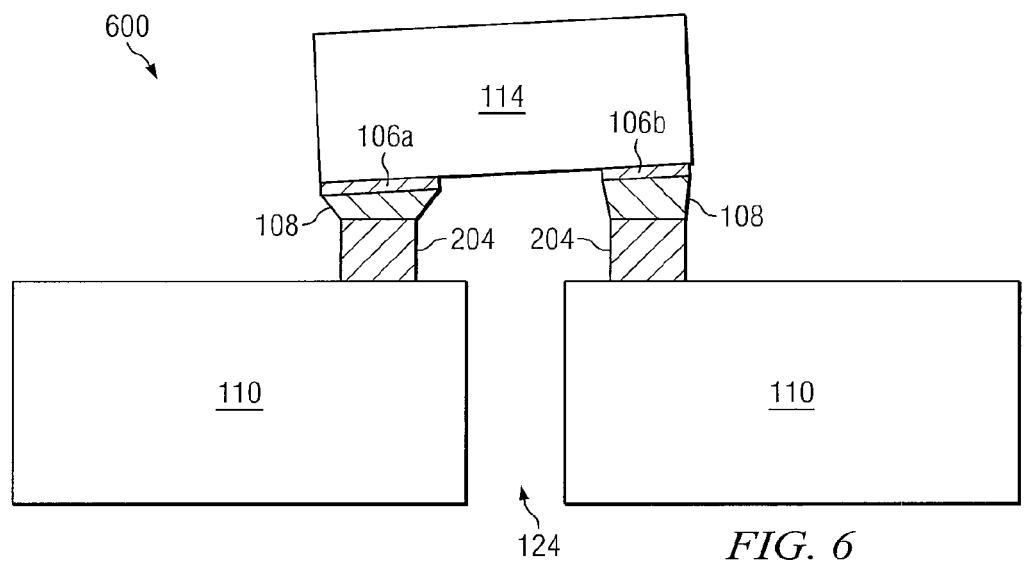
FIG. 6 illustrates a section of an example semiconductor assembly with solder pads of different dimensions placed on an optical chip, in accordance with one embodiment of the present disclosure.

FIG. 6 illustrates a section of an example semiconductor assembly 600 with solder pads 106 of different dimensions placed on optical chip 114, in accordance with one embodiment of the present disclosure. In the illustrated embodiment, pillars 204 may be formed on package 110. Solder bumps 108 may be formed on pillars 204 as described previously. Optionally, solder bumps 108 may be formed directly on package 110. Bond pad 106a may be larger than bond pad 106b. Thus, during bonding solder bump 108 may flow such that the clearance between optical chip 114 and package 110 may be smaller on the side of optical chip 114 corresponding to bond pad 106a. Additionally, during bonding solder bump 108 may flow onto bond pad 106b such that the clearance between optical chip 114 and package 110 may be larger on the edge of optical chip 114 corresponding to bond pad 106b. This inclination may allow optical information signal (not expressly shown) from and/or to optical chip 114 pass through channel 124 at the appropriate angle with respect to the optical deflectors (not expressly shown) for routing.

Figure 7:
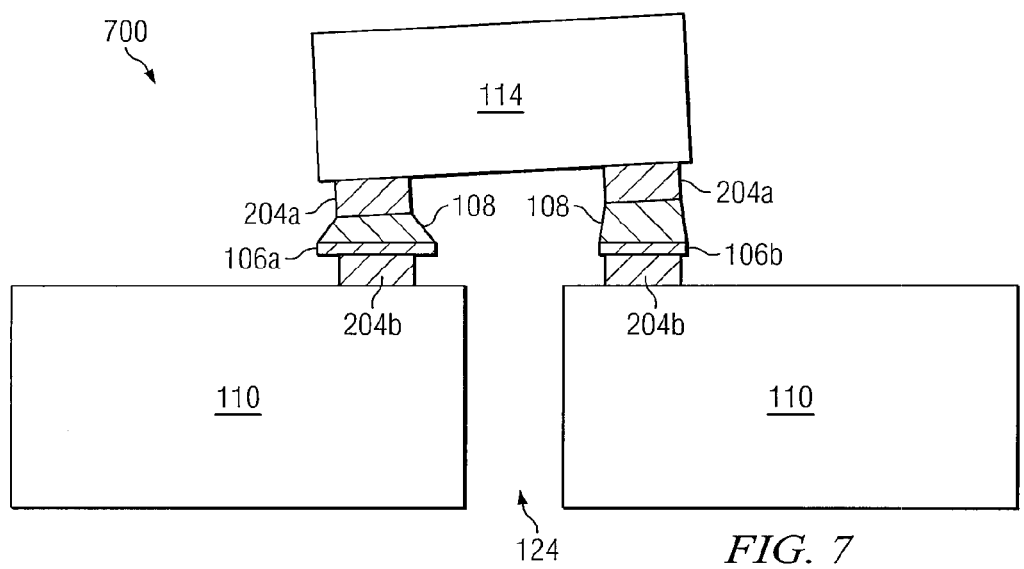
FIG. 7 illustrates a section of an example semiconductor assembly with bond pads of different dimensions placed on pillars extending from a package, in accordance with one embodiment of the present disclosure.

FIG. 7 illustrates a section of an example semiconductor assembly 700 with bond pads 108 of different dimensions placed on pillars 108 extending from package 110, in accordance with one embodiment of the present disclosure. In the illustrated embodiment, pillars 204b may be deposited on package 110 and pillars 204a may be deposited on optical die 114. Solder bumps 108 may be formed on pillars 204a as described previously. Bond pads 106 may be formed on pillars 204b, and bond pad 106a may be larger than bond pad 106b. Thus, during bonding solder bump 108 may flow such that the clearance between optical chip 114 and package 110 may be smaller on the side of optical chip 114 corresponding to bond pad 106a. Additionally, during bonding solder bump 108 may flow onto bond pad 106b such that the clearance between optical chip 114 and package 110 may be larger on the edge of optical chip 114 corresponding to bond pad 106b. This inclination may allow optical information signal (not expressly shown) from and/or to optical chip 114 pass through channel 124 at the appropriate angle with respect to the optical deflectors (not expressly shown) for routing.

Figure 8:
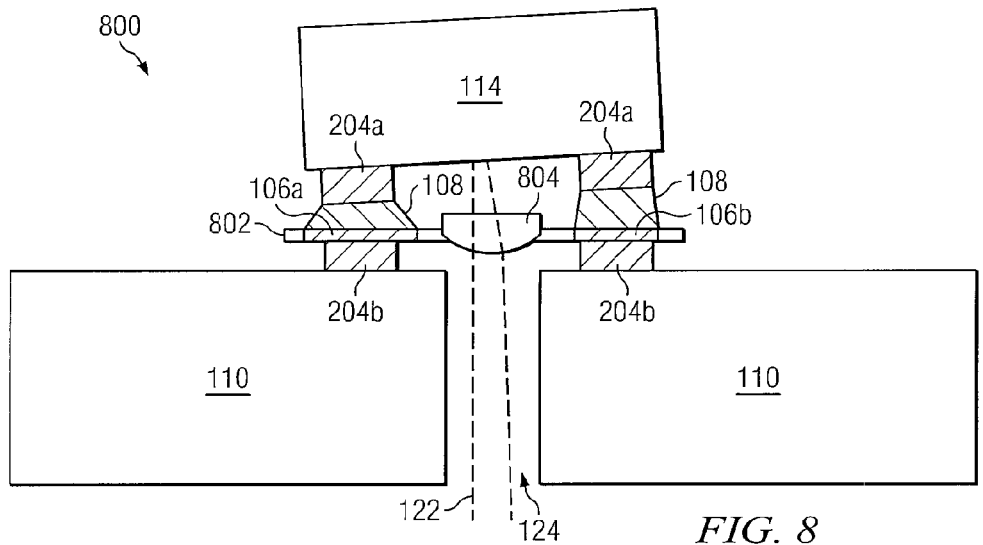
FIG. 8 illustrates a section of an example semiconductor assembly with bond pads of different dimensions as part of a mid-plate that includes a lens placed on pillars extending from a package, in accordance with one embodiment of the present disclosure.

FIG. 8 illustrates a section of an example semiconductor assembly 800 with bond pads 106 of different dimensions as part of mid-plate 802 that includes lens 804 placed on pillars 204 extending from package 110, in accordance with one embodiment of the present disclosure. In the illustrated embodiment, pillars 204a may be deposited on package 110 and pillars 204b may be deposited on optical die 114. Solder bumps 108 may be formed on pillars 204b as described previously. Bond pads 106 may be formed on pillars 204b, and bond pad 106a may be larger than bond pad 106b. Thus, during bonding solder bump 108 may flow such that the clearance between optical chip 114 and package 110 may be smaller on the side of optical chip 114 corresponding to bond pad 106a. Additionally, during bonding solder bump 108 may flow onto bond pad 106b such that the clearance between optical chip 114 and package 110 may be larger on the edge of optical chip 114 corresponding to bond pad 106b. This inclination may allow optical information signal 122 from and/or to optical chip 114 pass through channel 124 appropriately. Optionally, solder bumps 108 may be formed on pillars 204b extending from package 110. Bond pads 106 may be part of mid-plate 802 located between package 110 and optical chip 114. Mid-plate 802 may be used to suspend bond pads 106 between package 110 and optical chip 114 in order to conserve space on either package 110 and/or optical chip 114. For example, if neither package 110 nor optical chip 114 has space available for an increase in size of bond pad 106, then mid-plate 802 may be used to allow bond pads 106 to be increased in size. Mid-plate 802 may include lens 804 that may magnify or redirect optical information signal 122 as it passes through channel 124. For example, if bond pad 106 size cannot be accommodated to allow sufficient magnification or redirection of optical information signal 122, lens 804 may be used for the appropriate correction. Lens 804 may be a plano-convex glass lens to enhance the tuning effect or any other suitable lens.

Figure 9:
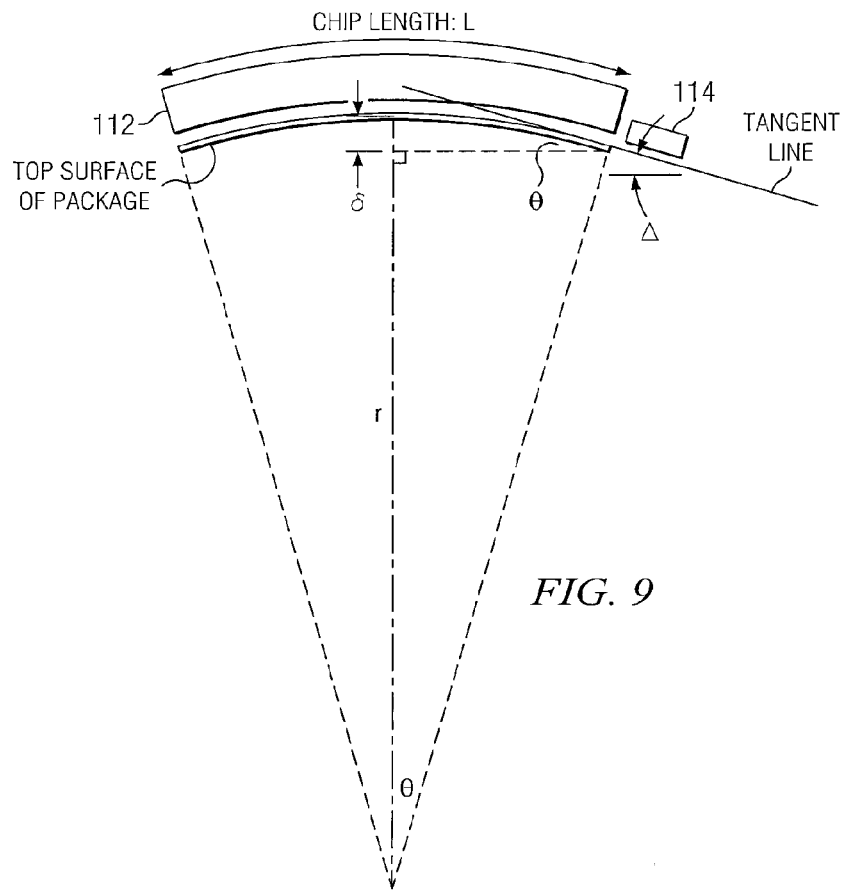
FIG. 9 illustrates a diagram of the effect of warpage on a semiconductor assembly, such as semiconductor assembly shown in FIGS. 4-8, in accordance with one embodiment of the present disclosure.

FIG. 9 illustrates a diagram of the effect of warpage on a semiconductor assembly, such as a semiconductor assembly shown in FIGS. 4-8, in accordance with some embodiments of the present disclosure. As discussed previously, as a semiconductor assembly experiences warpage, the angle of optical chips with respect to the substrate (tilt angle) may change such that optical information signals may not connect with the optical deflectors at appropriate angles. Once the expected tilt angle of the optical chip is determined, a determination may be made of the difference in height of the two ends of the optical chip to compensate for the tilt angle caused by warpage. In some embodiments of the present disclosure, the tilt angle θ may be determined by reference to FIG. 9 and using the following equations:

$$L = 2\theta r \quad (1); \text{ and}$$

$$\delta = r - r \cos\theta \quad (2);$$

where:
r = radius,
L = chip length, and
δ = chip warpage.

Using Taylor's Theorem:

$$\cos\theta|_{\theta\to 0} = 1 + \frac{d\cos\theta}{d\theta} \cdot (\theta - 0) = 1 - \sin\theta \cdot \theta.$$

Since:

$$\sin\theta|_{\theta\to 0} = \theta,$$

then:

$$\cos\theta|_{\theta\to 0} = 1 - \theta^2.$$

When θ is small (2) becomes:

$$\delta = r\theta^2 \quad (3),$$

and combining (1) and (3) yields:

$$\theta = \delta/(L/2).$$

Using optical chip tilt angle θ, the required vertical displacement Δ may be determined using the equation:

$$\Delta = \sin\theta(l/2)$$

where:
l=optical die length.

Figure 10:
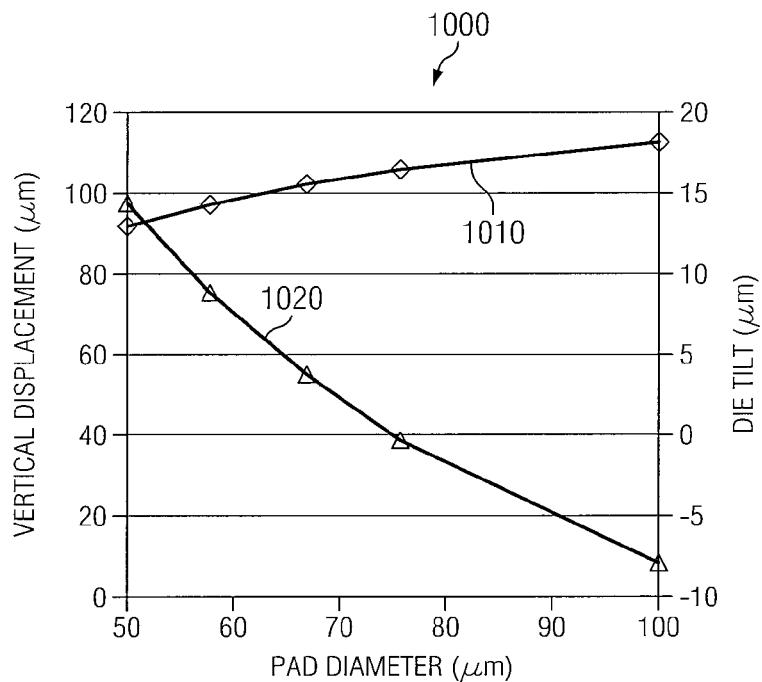
FIG. 10 illustrates a graph of vertical displacement and optical chip tilt as a function of bond pad effective diameter, in accordance with one embodiment of the present disclosure.

Using vertical displacement Δ, the corresponding bond pad effective diameter may be determined. For example, FIG. 10 illustrates graph 1000 of vertical displacement 1010 and optical chip tilt 1020 as a function of bond pad 106 effective diameter, in accordance with one embodiment of the present disclosure. Vertical displacement 1010, may measure the difference in height of solder 108 and pillar 204 from one bond pad 106 (e.g., bond pad 106*a* from FIGS. 4, 6 and 7) connecting optical chip 114 to package 110 to another bond pad 106 (e.g., bond pad 106*b* from FIGS. 4, 6 and 7). As effective pad diameter, e.g., bond pad 106*a* diameter increases, vertical displacement 1010, may also increase indicating that an increase in effective pad diameter of one pad may correspond to an increase in height difference of solder and pillars between both bond pads that couple optical chip 114 and package 110. Additionally, as pad diameter increases the optical chip tilt changes from positive to negative. This indicates that as pad diameter increases optical chip tilt may be controlled.

Figure 11:
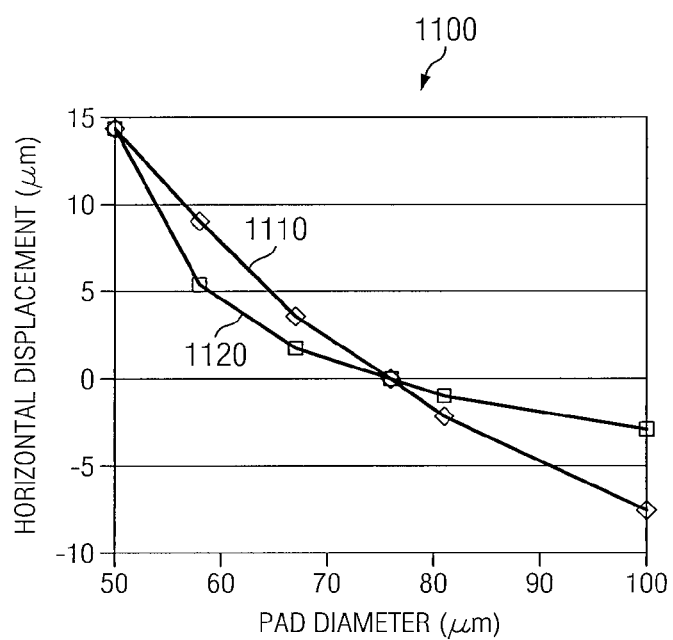
FIG. 11 illustrates a graph of optical chip tilt without using a lens and optical chip tilt with using a lens as a function of bond pad effective diameter, in a configuration as shown in FIG. 8, in accordance with one embodiment of the present disclosure.

FIG. 11 illustrates graph 1100 of optical chip tilt 1110 without using a lens and optical chip tilt 1120 using a lens as a function of bond pad 106 effective diameter, in a configuration as shown in FIG. 8, in accordance with one embodiment of the present disclosure. Optical chip tilt 1110 without using a lens may be similar to die tilt seen in FIG. 10 (e.g., plot 1020). Enhancement in optical chip tilt 1120 using a lens may occur in the range of pad diameters smaller than 75 microns. As effective pad diameter, e.g., bond pad 106*a* diameter increases, the optical chip tilt changes from positive to negative. This indicates that as pad diameter increases chip tilt may be controlled.

Figure 12:
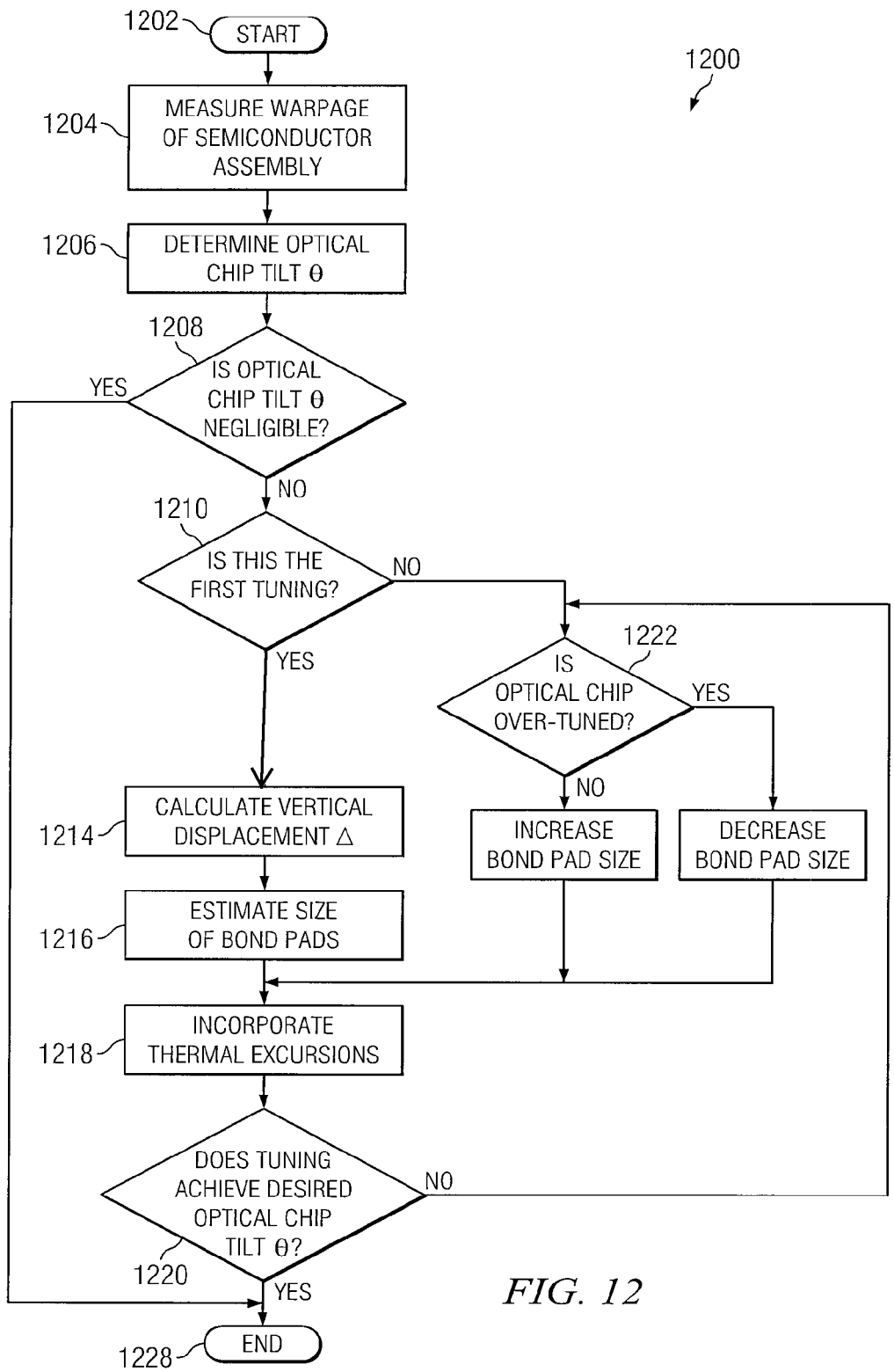
FIG. 12 illustrates a flow chart of an example method for determining bond pad dimensions adjustment to tune for warpage of the semiconductor assembly, in accordance with one embodiment of the present disclosure.

FIG. 12 illustrates a flow chart of an example method 1200 for determining bond pad dimensions adjustment to tune for warpage of the semiconductor assembly, in accordance with embodiments of the present disclosure. The steps of method 1200 may be performed by various computer programs, models or any combination thereof, configured to simulate and design bonding systems and associated warpage. The programs and models may include instructions stored on computer readable medium, and operable to perform, when executed, one or more of the steps described below. The computer readable media may include any system, apparatus or device configured to store and retrieve programs or instructions such as a hard disk drive, a compact disc, flash memory or any other suitable device. The programs and models may be configured to direct a processor or other suitable unit to retrieve and execute the instructions from the computer readable media. Collectively, the computer programs and models used to simulate and design semiconductor assemblies may be referred to as an "engineering tool." For illustrative purposes, method 1200 is described with respect to semiconductor assembly 400 of FIG. 4; however, method 1200 may be used to determine bond pad dimensions adjustment to tune for warpage of any suitable semiconductor assembly.

Method 1200 may start at step 1202, and at step 1204, a measurement may be made of the warpage of a semiconductor assembly, such as semiconductor assembly 400 of FIG. 4. Measurement of warpage may be made after semiconductor assembly 400 has been heated to the bonding temperature and cooled and/or warpage may be modeled by the engineering tool. Measurements of warpage may be made by shadow moiré, laser reflection, or any other suitable method for measuring warpage.

At step 1206, the required optical chip tilt θ, or inclination angle, may be determined based on the warpage measurements, the location of the optical chip on the package, the amount of deflection of the optical information signal, and the desired angle for the optical information signal to contact the optical board. For example, referring to FIG. 4, the angle at which optical chip 114 may align such that an optical information signal may pass through channel 124 may be determined. The equations and methodology discussed with respect to FIG. 9 may be used to determine the optical chip tilt θ of optical chip 114 shown in FIG. 4. The desired angle for optical information signal 122 to contact optical deflector 120 may be determined based on electrical design of optical board 104.

At step 1208, a determination may be made whether the optical chip tilt induced by warpage is negligible with respect to the desired optical chip angle. For example, it may be determined that optical chip tilt θ due to warpage may not be significant enough and may not affect the direction of optical information signal 122 enough to cause any loss of connectivity or information. If optical chip tilt θ is negligible then, method 1200 may end at step 1228. If optical chip tilt θ is not negligible then the method may continue to step 1210.

At step 1210, a determination may be made whether this is the first tuning for an optical chip. If it is a first tuning, the method may continue to step 1214. If this is a second or subsequent tuning, the method may continue to step 1222.

The dimensions of the optical chip may be determined in advance and at step 1214 the joint height difference (e.g., vertical displacement) from one side of the optical chip to the other side may be determine based on the optical chip tilt from step 1206 and the optical chip dimensions. For example, the size of optical chip 114 may be determined from measurement or a data sheet. The joint height difference may be calculated based on the optical chip tilt θ, from step 1206, and determining the vertical displacement Δ using the equation:

$$\Delta = \sin\theta(l/2)$$

where:
l=optical die length.

At step 1216, the size of the bond pads may be estimated. For example, using the vertical displacement Δ determined at step 1214 a graph similar to FIG. 10 may be used to determine bond pad 106 diameter.

At step 1218, any warpage or shrinkage from thermal excursions as the semiconductor assembly is heated to the bonding temperature and cooled may be incorporated.

At step 1220, it may be determined if the adjustment of the bond pads achieves the desired optical chip tilt. If the adjustment does achieve the desired optical chip tilt, then method 1200 may end at step 1228. If the adjustment does not achieve the desired optical chip angle, then method 1200 may continue to step 1222.

If this is not the first tuning or the adjustment of the bond pads did not achieve the desired optical chip tilt, the method may continue to step 1222. At step 1222, a determination is made whether the optical chip tilt is over-tuned. In other words, a determination is made whether the optical chip tilt is higher than required to contact the deflector in the optical layer of the optical board. If the optical chip is over-tuned, then the size of bond pad 106 may be decreased at step 1224. If the optical chip is not over-tuned, the size of bond pad 106 may be increased at step 1226. Adjustment of bond pad 106 at either step 1224 or step 1226 may return method 1200 to step 1218.

Method 1200 may be completed once for a particular semiconductor assembly and then may be used to fabricate assemblies based on the output of method 1200. Additionally, method 1200 may be repeated many times for one or multiple semiconductor assemblies.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions has been described in detail, it should be understood that the various changes, substitutions, and alterations could be made hereto without departing from the spirit and scope of the invention.

What is claimed is:

1. A method for alignment of a first substrate coupled to a second substrate, comprising:
    determining an inclination angle for the first substrate or the second substrate due to warpage;
    determining a joint height difference based on the inclination angle; and
    configuring a size for one or more bond pads based on the joint height difference.

2. The method of claim 1, further comprising:
    determining whether the configured bond pad sizes achieve the determined joint height difference; and
    when the configured bond pad sizes do not achieve the determined joint height difference, adjusting the bond pad sizes until the determined joint height difference is achieved.

3. The method of claim 1, wherein determining the joint height difference comprises calculating a solder volume.

4. The method of claim 1, wherein determining the joint height difference comprises calculating the height of a pillar.

5. The method of claim 1, wherein determining the joint height difference comprises calculating the height of a mid-plate having a lens.

6. The method of claim 1, further comprising adjusting the bond pad sizes based on warpage or shrinkage from thermal excursions.

7. The method of claim 1, wherein calculating the inclination angle comprises determining dimensions of the first substrate.

8. A method for providing a semiconductor assembly, comprising:
    providing a first substrate;
    positioning a plurality of joints for a reflow operation, the plurality of joints comprising a plurality of solder bumps and a first plurality of pillars; and
    coupling a second substrate to the first substrate, the second substrate comprising:
        a plurality of bond pads, the size of the plurality of bond pads configured to provide a joint height difference between the plurality of joints to account for an inclination angle of either the first substrate or the second substrate due to warpage; and
        a second plurality of pillars between a surface of the second substrate and the plurality of bond pads.

9. The method of claim 8, wherein the first substrate comprises a die and the second substrate comprises a package.

10. The method of claim 8, wherein the first substrate comprises a package and the second substrate comprises a die.

11. The method of claim 8, wherein the plurality of bond pads comprise a mid-plate having a lens.

12. A semiconductor assembly, comprising:
    a first substrate;
    a plurality of joints positioned for a reflow operation, the plurality of joints comprising a plurality of solder bumps and a first plurality of pillars; and
    a second substrate coupled to the first substrate, the second substrate comprising:
        a plurality of bond pads, the size of the plurality of bond pads configured to provide a joint height difference between the plurality of joints to account for an inclination angle of either the first substrate or the second substrate due to warpage; and
        a second plurality of pillars between a surface of the second substrate and the plurality of bond pads.

13. The assembly of claim 12, wherein the first substrate comprises a die and the second substrate comprises a package.

14. The assembly of claim 12, wherein the first substrate comprises a package and the second substrate comprises a die.

15. The assembly of claim 12, wherein the plurality of bond pads comprise a mid-plate having a lens.

\* \* \* \* \*